(12) United States Patent
Vahidsafa et al.

(10) Patent No.: US 8,181,073 B2
(45) Date of Patent: May 15, 2012

(54) SRAM MACRO TEST FLOP

(75) Inventors: Ali Vahidsafa, Palo Alto, CA (US);
Robert P. Masleid, Monte Sereno, CA (US); Jason M. Hart, Hayden, ID (US);
Zhirong Feng, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 386 days.

(21) Appl. No.: 12/565,689

(22) Filed: Sep. 23, 2009

(65) Prior Publication Data

US 2011/0072326 A1     Mar. 24, 2011

(51) Int. Cl.
*G01R 31/28* (2006.01)

(52) U.S. Cl. .......... 714/726; 714/731; 714/30; 714/718; 714/729; 714/733; 714/734; 711/104; 327/202; 327/208; 327/199; 327/216; 327/218; 365/201

(58) Field of Classification Search .................. None
See application file for complete search history.

(56) References Cited

U.S. PATENT DOCUMENTS

| | | | | |
|---|---|---|---|---|
| 5,130,568 A * | 7/1992 | Miller et al. | .................. | 327/202 |
| 5,378,934 A * | 1/1995 | Takahashi et al. | ............ | 327/203 |
| 5,619,511 A * | 4/1997 | Sugisawa et al. | ............. | 714/726 |
| 5,668,490 A * | 9/1997 | Mitra et al. | .................... | 327/203 |
| 5,938,782 A * | 8/1999 | Kay | .............................. | 714/726 |
| 5,973,529 A * | 10/1999 | Chappell et al. | .............. | 327/200 |
| 6,389,566 B1 * | 5/2002 | Wagner et al. | ................ | 714/726 |
| 2002/0074609 A1* | 6/2002 | Maruyama | .................... | 257/390 |
| 2002/0078410 A1* | 6/2002 | Matsushima | ................. | 714/726 |
| 2003/0066001 A1* | 4/2003 | Sera et al. | ..................... | 714/726 |
| 2003/0066002 A1* | 4/2003 | Kanba | ........................... | 714/726 |
| 2004/0095161 A1* | 5/2004 | Campbell | ....................... | 326/98 |
| 2004/0128635 A1* | 7/2004 | Sahara et al. | ..................... | 716/6 |
| 2005/0235185 A1* | 10/2005 | Campbell | ..................... | 714/726 |
| 2007/0162802 A1* | 7/2007 | Miwa | ............................ | 714/726 |
| 2007/0250798 A1* | 10/2007 | Chaudhry et al. | ................ | 716/4 |
| 2008/0315912 A1* | 12/2008 | Satsukawa | ...................... | 326/16 |

* cited by examiner

*Primary Examiner* — John Trimmings
(74) *Attorney, Agent, or Firm* — Osha Liang LLP

(57) ABSTRACT

A SRAM (Static Random Access Memory) macro test flop circuit includes a flip-flop circuit, a scan control circuit, and an output buffer circuit. The flip-flop circuit includes a master latch circuit and a slave latch circuit. The master latch circuit includes a master feed-back circuit including a master storage node and a master feed-forward circuit. The slave latch circuit includes a slave feed-back circuit including a slave storage node and a slave feed-forward circuit driven from the master latch. The scan control circuit includes a scan slave feed-forward circuit, a scan latch circuit, and a scan driver circuit driven by the scan feed-back circuit. The scan latch circuit includes a scan feed-back circuit comprising a scan storage node and a scan feed-forward circuit driven from the slave latch. The output buffer circuit includes a master driver driven from master latch circuit and a slave driver driven from slave latch circuit.

17 Claims, 4 Drawing Sheets

SRAM MACRO TEST FLOP

BACKGROUND

Flip-flops are widely used state elements that hold a particular state for a full clock cycle. A flip-flop consist of two latches connected serially, a master latch and a slave latch. The slave latch provides the flip-flop output. Thus, a scan function for test capability is provided by integrating a scan latch with the slave latch of flip-flop. In both a user mode and a test mode of operation, however, the output of master latch remains internal to the flip-flop.

SUMMARY

In one or more embodiments, the present invention relates to a SRAM (Static Random Access Memory) macro test flop circuit, driven by a source clock signal, comprising: a flip-flop circuit comprising: a master latch circuit comprising: a master feed-back circuit comprising a master storage node, and a master feed-forward circuit, wherein the master feed-forward circuit provides a control signal for writing to the master storage node, and a slave latch circuit comprising: a slave feed-back circuit comprising a slave storage node, and a slave feed-forward circuit operatively driven from the master latch, wherein the slave feed-forward circuit provides a control signal for writing to the slave storage node, a scan control circuit comprising: a scan slave feed-forward circuit providing a control signal for writing a scan data to the slave storage node, a scan latch circuit comprising: a scan feed-back circuit comprising a scan storage node, a scan feed-forward circuit operatively driven from the slave latch, wherein the scan feed-forward circuit provides a control signal for writing to the scan storage node, and a scan driver, with a scan output port, operatively driven by the scan feed-back circuit, and an output buffer circuit comprising: a master driver, with a master output port, operatively driven from the master latch, and a slave driver, with a slave output port, operatively driven from the slave latch.

In one or more embodiments, the present invention relates to a semiconductor device comprising: a mechanical package; and a semiconductor die comprising: a semiconductor layer, a plurality of metal layers, a clock distribution network that distributes a clock signal within the die, and a SRAM (Static Random Access Memory) macro test flop circuit, driven by a source clock signal, comprising: a flip-flop circuit comprising: a master latch circuit comprising: a master feed-back circuit comprising a master storage node, and a master feed-forward circuit, wherein the master feed-forward circuit provides a control signal for writing to the master storage node, and a slave latch circuit comprising: a slave feed-back circuit comprising a slave storage node, and a slave feed-forward circuit operatively driven from the master latch, wherein the slave feed-forward circuit provides a control signal for writing to the slave storage node, a scan control circuit comprising: a scan slave feed-forward circuit providing a control signal for writing a scan data to the slave storage node, a scan latch circuit comprising: a scan feed-back circuit comprising a scan storage node, a scan feed-forward circuit operatively driven from the slave latch, wherein the scan feed-forward circuit provides a control signal for writing to the scan storage node, and a scan driver, with a scan output port, operatively driven by the scan feed-back circuit, and an output buffer circuit comprising: a master driver, with a master output port, operatively driven from the master latch, and a slave driver, with a slave output port, operatively driven from the slave latch.

In one or more embodiments, the present invention relates to a system comprising: an input device; an output device; a mechanical chassis; a printed circuit board; and a semiconductor device comprising: a mechanical package; and a semiconductor die comprising: a semiconductor layer, a plurality of metal layers, a clock distribution network that distributes a clock signal within the die, and a SRAM (Static Random Access Memory) macro test flop circuit, driven by a source clock signal, comprising: a flip-flop circuit comprising: a master latch circuit comprising: a master feed-back circuit comprising a master storage node, and a master feed-forward circuit, wherein the master feed-forward circuit provides a control signal for writing to the master storage node, and a slave latch circuit comprising: a slave feed-back circuit comprising a slave storage node, and a slave feed-forward circuit operatively driven from the master latch, wherein the slave feed-forward circuit provides a control signal for writing to the slave storage node, a scan control circuit comprising: a scan slave feed-forward circuit providing a control signal for writing a scan data to the slave storage node, a scan latch circuit comprising: a scan feed-back circuit comprising a scan storage node, a scan feed-forward circuit operatively driven from the slave latch, wherein the scan feed-forward circuit provides a control signal for writing to the scan storage node, and a scan driver, with a scan output port, operatively driven by the scan feed-back circuit, and an output buffer circuit comprising: a master driver, with a master output port, operatively driven from the master latch, and a slave driver, with a slave output port, operatively driven from the slave latch.

Other aspects and advantages of the invention will be apparent from the following description and the appended claims.

DETAILED DESCRIPTION

Figure 1:
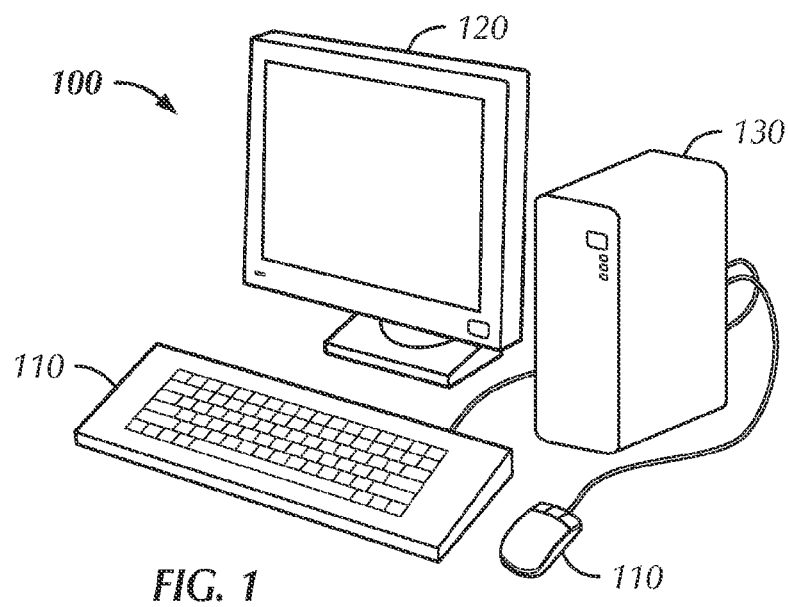
FIG. 1 shows a system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a system in accordance with one or more embodiments of the present invention. A system 100 includes input devices 110, an output device 120, and a mechanical chassis 130. The mechanical chassis 130 includes a printed circuit board ("PCB"), a network device, and a storage device (not shown).

Figure 2:
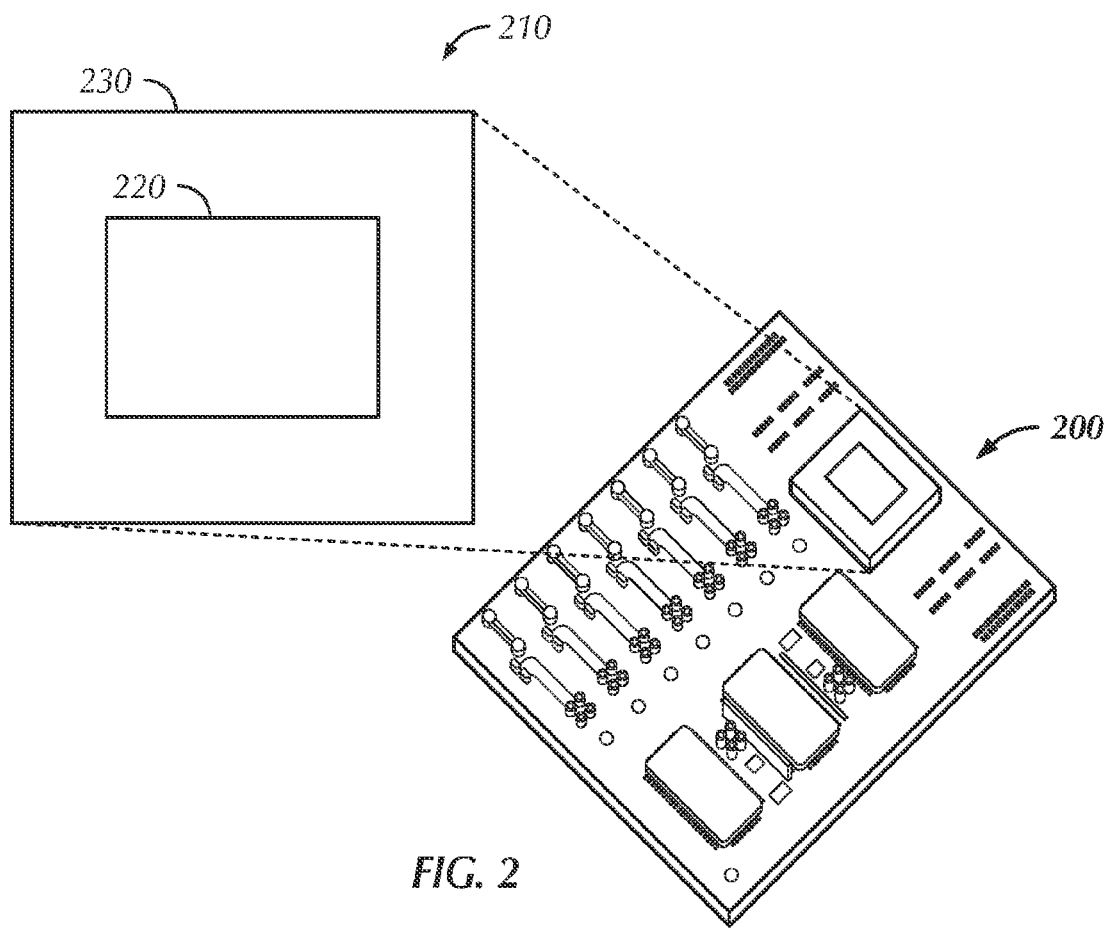
FIG. 2 shows a printed circuit board that includes one or more semiconductor device(s) that each includes one or more semiconductor die in accordance with one or more embodiments of the present invention.

FIG. 2 shows a printed circuit board that includes one or more semiconductor device(s) that each include one or more semiconductor die in accordance with one or more embodiments of the present invention. The PCB 200 may be included in system 100 of FIG. 1 and includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 210. The mechanical package 230 provides the external clock signal(s) to the die 220. The die 220 is comprised of a plurality of metal layers and a semiconductor layer. The die 220 generates one or more internal clock signals that are a function of the provided external clock signal(s). The internal clock signals are typically the most heavily loaded, the most widely distributed, and the fastest signals within the die 220. Clock distribution networks are used to provide the clock signals to the proper loads within the die 220.

The clock distribution network is organized as a hierarchy of three functional layers that distribute the clock within the semiconductor die: the tree layer, the grid layer, and the local layer. The tree layer includes a fractal clock tree that spans a large area of the die. The grid layer includes clock routes to the individual clock users via a clock grid. The local layer includes clock routes to the actual flip-flops.

A typical flip-flop has slave latch output as the flip-flop output, whereas master latch output stays inside the flip-flop. The special testing requirement of SRAM (Static Random Access Memory) requires that master latch output be available outside the flip-flop. Thus a flip-flop for special SRAM testing has two outputs, the master latch output for testing and the slave latch output for user operation. Since master latch output is a test port, the scan and/or test data is loaded to the master latch for testing.

Figure 3:
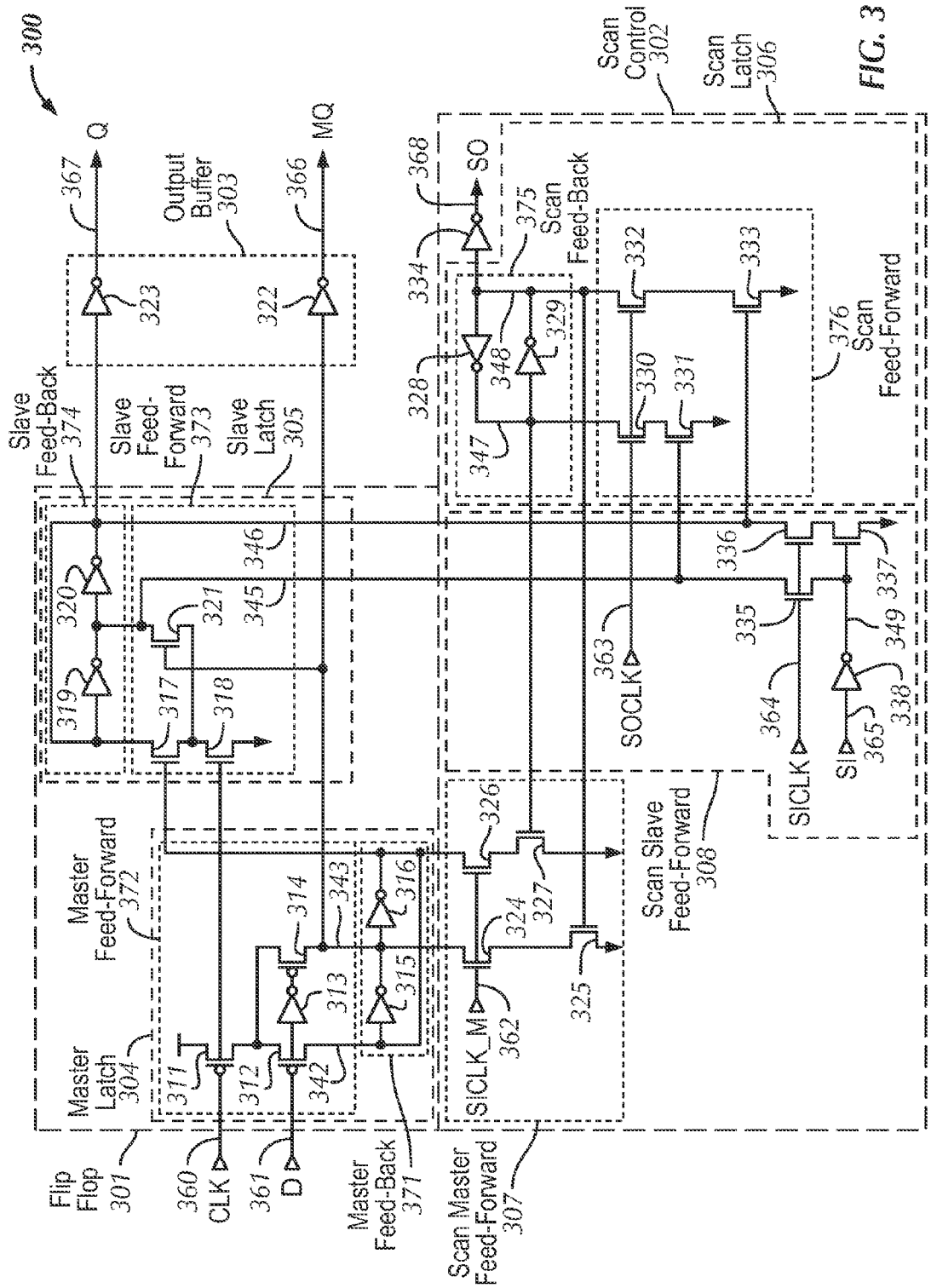
FIG. 3 shows a first SRAM macro test flop in accordance with one or more embodiments of the present invention.

FIG. 3 shows a first SRAM macro test flop 300 in accordance with one or more embodiments of the present invention. The first SRAM macro test flop 300 consists of three major blocks, flip-flop 301, scan control 302, and an output buffer 303. The output buffer 303 contains two drivers (master driver 322 and slave driver 323) to provide outputs respectively from master latch and slave latch of the flip-flop. The output from the master latch is fed as an input to the master driver 322, with master driver 322 driving MQ 366 as the master output from the flip-flop. The output from the slave latch is fed as an input to the slave driver 323, with slave driver 323 driving Q 367 as the slave output from the flip-flop.

The flip-flop 301 is driven by a clock signal, CLK 360, and a data-in signal, D 361. The flip-flop is comprised of n-channel field effect transistors ("N-FETs"), p-channel field effect transistors ('P-FETs"), and inverters. The flip-flop 301 consists of two main components, a master latch 304 and a slave latch 305. The master latch 304 comprises master feed-forward 372 and master feed-back 371. The master feed-forward 372 of the master latch 304 is comprised of P-FET 311, P-FET 312, P-FET 314, and inverter 313. The master feed-back 371 of the master latch 304 is comprised of inverters 315 and 316 with back-to-back connection. In the back-to-back connection of inverters 315 and 316, output of inverter 315 is fed as input to inverter 316 and output of inverter 316 is fed as input to inverter 315. The output of inverter 316 in the master feed-back 371 forms a master storage node 342. The output of inverter 315 is another master storage node 343, wherein data at master storage node 343 is opposite in polarity to data at master storage node 342. The master feed-forward 372 provides control signals for writing to master feed-back 371.

The master latch 304 has two modes of operation, a transparent mode and a hold mode. In the transparent mode, CLK 360 is at a low logic state and data-in signal at D 361 is transmitted through the master latch 304 to the output of master latch 304 at master storage node 342. In the hold mode, CLK 360 is at a high logic state and master feed-back 371 of the master latch 304 maintains the previous logic state on master storage node 342 (and, the complementary logic state on the master storage node 343). The master storage node 343 provides input to the master driver 322, with output of master driver 322 driving as master output MQ 366. The master output MQ 366 is the output from master latch 304 of the flip-flop 301.

In the transparent mode of master latch 304, P-FET 311 is enabled with CLK 360 at a low logic state. It is well known in the art that P-FET is enabled with a low logic state on the gate of P-FET. The P-FET 312 is enabled for the case of data-in D 361 at low logic state. Under these conditions of CLK 360 at low logic state and D 361 at low logic state, a high logic state is written at master storage 342 by a pull-up path to supply voltage through P-FET 311 and P-FET 312. The master storage node 343 will be at a complementary level of low logic state. The P-FET 311 and P-FET 312 have to be sized appropriately to overcome potential contention presented by inverter 316 during the writing. The contention is presented if inverter 316 is forcing master storage node 342 to a low logic state, while series stack of P-FET 311 and P-FET 312 tries to write a high logic state at master storage node 342. The potential contention is only during the period of transition and disappears when writing the correct data (i.e. high logic state) to master storage node 342 is successfully completed. During a subsequent hold mode with CLK 360 at a high logic state, master storage node 342 will maintain the previously written high logic state, and master storage node 343 will maintain the previously written low logic state.

In the other case for transparent mode of master latch 304, data-in D 361 is at high logic state. The gate of P-FET 314 is at low logic state (due to inverter 313), and thus P-FET 314 is enabled. Under these conditions of CLK 360 at low logic state for transparent mode and data-in D 361 at high logic state, a high logic state is written at master storage node 343 by a pull-up path to supply voltage through P-FET 311 and P-FET 314. The master storage node 342 will be at a complementary level of low logic state. Once again, the P-FET 311 and P-FET 314 have to be sized appropriately to overcome potential contention presented by inverter 315 during the writing. During a subsequent hold mode with CLK 360 at a high logic state, master storage node 342 will maintain the previously written low logic state, and master storage node 343 will maintain the previously written high logic state.

It is clear from the description above that the polarity of data on master storage node 342 is opposite to polarity of data on D 361. But while the polarity of data on master storage node 343 is same as polarity of data on D 361, the polarity of data on master output MQ 366 is opposite to polarity of data on D 361 (due to an extra inversion in polarity by master driver 322). It will be obvious to those skilled in the art, that other embodiments with different polarities can be easily derived without deviating from the present invention. Accordingly, the specific arrangement of components shown in FIG. 3 should not be construed as limiting the scope of the present invention.

The slave latch 305 comprises slave feed-forward 373 and slave feed-back 374. The slave feed-forward 373 of the slave latch 305 is comprised of N-FET 317, N-FET 318, and N-FET 321. The slave feed-back 374 of the slave latch 305 is comprised of inverters 319 and 320 with back-to-back connection. In the back-to-back connection of inverters 319 and 320, output of inverter 319 is fed as input to inverter 320 and output of inverter 320 is fed as input to inverter 319. The output of inverter 320 in the slave feed-back 374 forms a slave storage node 346. The output of inverter 319 forms another slave storage node 345, wherein data at slave storage node 345 is opposite in polarity to data at slave storage node 346. The slave feed-forward 373 provides control signals for writing to slave feed-back 374.

The slave latch 305 also has two modes of operation, a transparent mode and a hold mode. In the transparent mode, CLK 360 is at a high logic state and data at master storage node 342 is transmitted through the slave latch 305 to the output of slave latch 305 at slave storage node 346. In the hold mode, CLK 360 is at a low logic state and slave feed-back 374 of the slave latch 305 maintains the previously written logic states on slave storage nodes 345 and 346. The slave storage node 346 provides input to the slave driver 323, with output of slave driver 323 driving as slave output Q 367. The slave output Q 367 is the output from slave latch 305 of the flip-flop 301.

In the transparent mode of slave latch 305, N-FET 318 is enabled with CLK 360 at a high logic state. It is well known in the art that N-FET is enabled with a high logic state on the gate of N-FET. The N-FET 317 is enabled for the case of master storage node 342 at high logic state. Under these conditions of CLK 360 at high logic state and master storage node 342 at high logic state, a low logic state is written at slave storage node 346 by a pull-down path to ground through N-FET 317 and N-FET 318. The slave storage node 345 will be at a complementary level of high logic state. The N-FET 317 and N-FET 318 have to be sized appropriately to overcome potential contention presented by inverter 320 during the writing. The contention is presented if inverter 320 is forcing slave storage node 346 to a high logic state, while series stack of N-FET 317 and N-FET 318 is trying to write a low logic state at slave storage node 346. The potential contention is only during the period of transition and disappears when writing the correct data (i.e. low logic state) to slave storage node 346 is successfully completed. During a subsequent hold mode with CLK 360 at a low logic state, slave storage node 346 will maintain the previously written low logic state.

In the other case for transparent mode of slave latch 305, the master storage node 342 is at low logic state (and, corresponding master storage node 343 is at high logic state) and the N-FET 321 is enabled. Under these conditions of CLK 360 at high logic state and master storage node 343 at high logic state, a low logic state is written at slave storage node 345 by a pull-down path to ground through N-FET 321 and N-FET 318. A complementary level of high logic state will be written to the slave storage node 346. Once again, the N-FET 321 and N-FET 318 have to be sized appropriately to overcome potential contention presented by inverter 319 during the writing. During a subsequent hold mode with CLK 360 at a low logic state, slave storage node 346 will maintain the previously written high logic state.

The flip-flop 301 can now be described based upon the master latch 304 and slave latch 305 described above. During CLK 360 at low logic state, data-in at D 361 is transmitted through the master latch 304 to master storage node 342. But during CLK 360 at a low logic state, slave latch 305 is in hold state and is thus blocked from receiving new data. During subsequent CLK 360 at high logic state, the master latch 304 is in hold state and maintains the previously written data on master storage node 342. But with CLK 360 in high logic state now, slave latch 305 is in transparent mode and previous stored data at master storage node 342 is transmitted through slave latch 305 and slave driver 323 to slave output Q 367. During the next clock cycle with CLK 360 at low logic state, master latch 304 will be in transparent mode and ready to receive new data. The slave output data at Q 367 may change once every cycle, on a low to high transition edge of the clock CLK 360. It will be obvious to those skilled in the art, that other embodiments can be easily derived with output data changing on a high to low transition edge of the clock. Accordingly, the specific arrangement of components shown in FIG. 3 should not be construed as limiting the scope of the present invention.

The scan control 302 is integrated with flip-flop 301 for test capability. The scan control 302 comprises scan latch 306, scan master feed-forward 307, scan slave feed-forward 308, and scan driver 334. The scan latch 306 comprises scan feed-forward 376 and scan feed-back 375. The scan feed-forward 376 of the scan latch 306 is comprised of N-FET 330, N-FET 331, N-FET 332, and N-FET 333. The scan feed-back 375 in the scan latch 306 comprises inverter 328 and inverter 329 connected back-to-back to form scan storage node 348 (and, scan storage node 347 with a complementary logic state). The scan storage node 348 drives the input of scan driver 334, where the output of scan driver 334 is scan out signal SO 368. The SO 368 signal is available outside the first SRAM macro test flop 300 for test mode. The SRAM testing requires that test data (e.g. scan data) be loaded into master latch 304 of flip-flop 301. This is accomplished in 3 steps, scan-in step to load scan data to slave latch 305, scan-out step to transfer the data loaded into slave latch 305 to scan latch 306, and scan-master step to load the data from scan latch 306 to master latch 304.

During the first scan step (i.e. scan-in step), the scan-in data is written to the slave feed-back 374 of slave latch 305 with scan-in clock SICLK 364 at a high logic state. The scan slave feed-forward 308 provides control signals for writing to slave feed-back 374 during scan operation. This condition is similar to transparent mode for slave latch 305 described above. For the case of scan-in signal SI 365 at high logic state, node 349 is at low logic state (due to inverter 338). Under these conditions of SICLK 364 at high logic state and node 349 at low logic state, a low logic state is written at slave storage node 345 of slave feed-back 374 by a pull-down path to ground through N-FET 335 and inverter 338. The slave storage node 346 is not forced by SI 365 since N-FET 337 is in off-state (the gate of N-FET 337 is connected to low logic state of node 349). The N-FET 335 and inverter 338 have to be sized appropriately to overcome potential contention presented by inverter 319 during the writing. The contention is present if inverter 319 is forcing slave storage node 345 to a high logic state, while series stack of N-FET 335 and inverter 338 tries to write a low logic state at slave storage node 345. The potential contention is only during the period of transition and disappears when writing the correct data (i.e. low logic state) to slave storage node 345 is successfully completed.

For the case of SI 365 at low logic state (and node 349 at high logic state due to inverter 338) in the first scan step, a low logic state is written at slave storage node 346 of slave feed-back 374 by a pull-down path to ground through N-FET 336 and N-FET 337. There is also help by node 349 trying to force a high logic state at slave storage node 345 through N-FET 335. Once again, The N-FET 336 and N-FET 337 have to be sized appropriately to overcome potential contention.

During the second scan step (i.e. scan-out step), data in the slave feed-back 374 is written to scan feed-back 375 of scan latch 306. The scan feed-forward 376 provides control signals for writing to scan feed-back 375. The scan latch 306 has two modes of operation, a transparent mode and a hold mode. The scan-out clock SOCLK 363 is at high logic state during the transparent mode in the scan-out step. For the case of slave storage node 346 at high logic state, a low logic state is written at scan storage node 348 of scan feed-back 375 by a pull-down path to ground through N-FET 332 and N-FET 333. For the case of slave storage node 345 in high logic state, a low logic state is written at scan storage node 347 of scan feed-back 375 by a pull-down path to ground through N-FET 330 and N-FET 331. Once again, the N-FET 330 and N-FET 331 as well as N-FET 332 and N-FET 333 have to be sized appropriately to overcome potential contentions. With the SOCLK 363 at low logic state in the hold mode, the scan feed-back 375 maintains the previously written data (i.e. data written during the transparent mode) on scan storage nodes 347 and 348.

During the third/final scan step (i.e. scan-master step), data from scan feed-back 375 is written into master feed-back 371 of master latch 304. The scan master feed-forward 307 provides the control signals for writing to master feed-back 371. The master scan-in clock SICLK_M 362 is at high logic state during this step. This condition is similar to transparent mode for master latch 304 described above. For the case of scan storage node 348 at high logic state, low logic state is written at master storage node 343 through pull-down action of N-FET 324 and N-FET 325 connected in series. For the case of scan storage node 347 at high logic state, low logic state is written at master storage node 342 through pull-down action of N-FET 326 and N-FET 327 connected in series. Once again, the N-FET 324 and N-FET 325 as well as N-FET 326 and N-FET 327 have to be sized appropriately to overcome potential contentions.

It is important for CLK 360 to be in high logic state during this scan step, such that any attempt for writing to master latch 304 by data-in D 361 is blocked. A simultaneous writing to master latch 304 by both data-in D 361 and scan data will create contention and is not allowed. In this final scan step, scan data is loaded into the master latch 304. The master storage node 343 in master latch 304 drives input of master driver 322. The output of master driver 322 provides master output signal MQ 366 which can be used for testing.

FIG. 3 describes, in one or more embodiments of present invention, making master latch output accessible outside the flip-flop and the ability to write scan/test data to master latch. Thus, scan/test data can be written to the master latch of the flip-flop and special SRAM testing can be carried out. Furthermore, a master output port MQ 366 has been provided to read out the master output data. It will be obvious to those skilled in the art, that other embodiments with different configurations can be easily derived without deviating from the spirit of the present invention.

Figure 4:
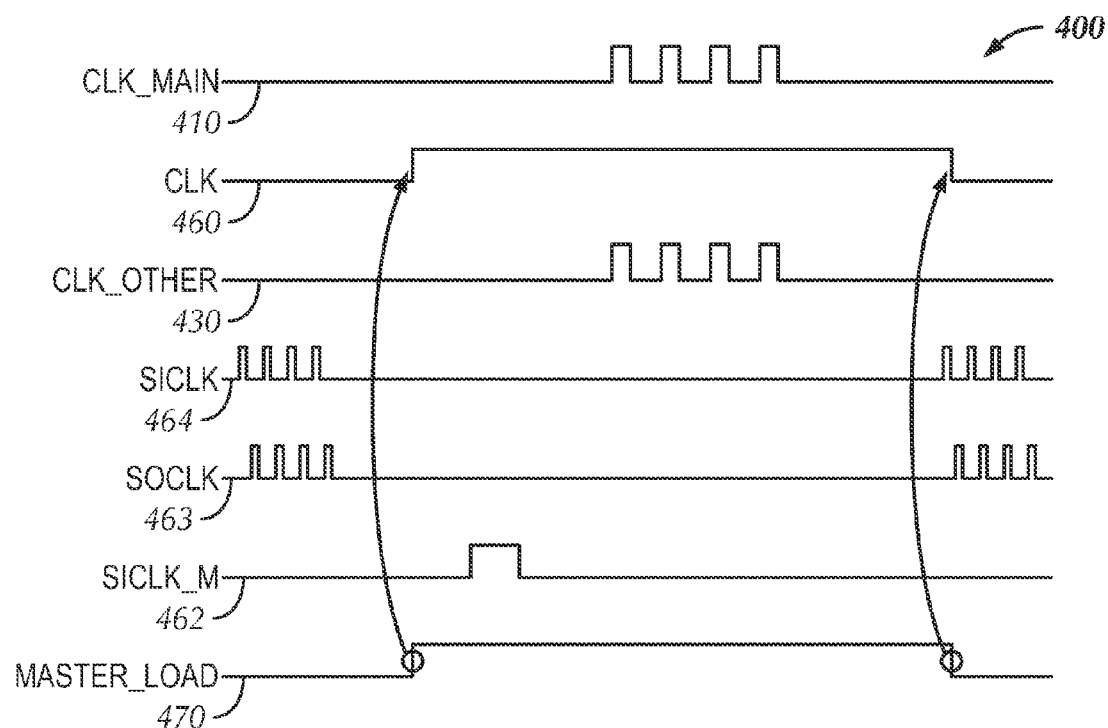
FIG. 4 shows a timing waveform in accordance with one or more embodiments of the present invention.

FIG. 4 shows timing waveforms 400 for one or more embodiments of present invention. The timing waveforms 400 shows timing for some signals used in first SRAM macro test flop 300 of FIG. 3. The SICLK 464 of FIG. 4 is the timing for signal SICLK 364 of FIG. 3, SOCLK 463 of FIG. 4 is the timing for signal SOCLK 363 of FIG. 3, SICLK_M 462 of FIG. 4 is timing for signal SICLK_M 362 of FIG. 3, and CLK 460 of FIG. 4 is timing for signal CLK 360 of FIG. 3.

In explaining the timing signals in FIG. 4, reference is also made back to FIG. 3. It has been already mentioned in the description of FIG. 3 that CLK 360 should mentioned be at high logic state during writing scan data to master latch. Referring again to FIG. 3, it is necessary for CLK 360 to be in high logic state to avoid contention, i.e., so as to avoid any attempt to write to the master latch 304 simultaneously by both data-in D 361 and scan data. The timing diagram shown in FIG. 4 illustrates one or more embodiments of present invention that avoid such a contention.

In FIG. 4, CLK_MAIN 410 is the main system clock. During writing scan data to the master latch, a control signal MASTER_LOAD 470 is asserted to a high logic state. A high logic state of MASTER_LOAD 470 asserts CLK 460 to high logic state by appropriate logic design. This disables writing to master latch by data-in, and thus scan data can be written to master latch without a contention. The timing signal SICLK_M 462 shows one or more embodiments of present invention for writing scan data to the master latch. Furthermore, CLK_OTHER 430 is shown with same timing as main clock CLK_MAIN 410, since CLK_OTHER 430 is not gated by the control signal MASTER_LOAD 470. CLK_OTHER 430 is used as clock for all other flip-flops where writing scan data to the master latch is not intended.

While the timing in FIG. 4 is explained for illustration, it will be obvious to those skilled in the art, that other embodiments with different signal timing can be easily derived without deviating from the spirit of the present invention.

Figure 5:
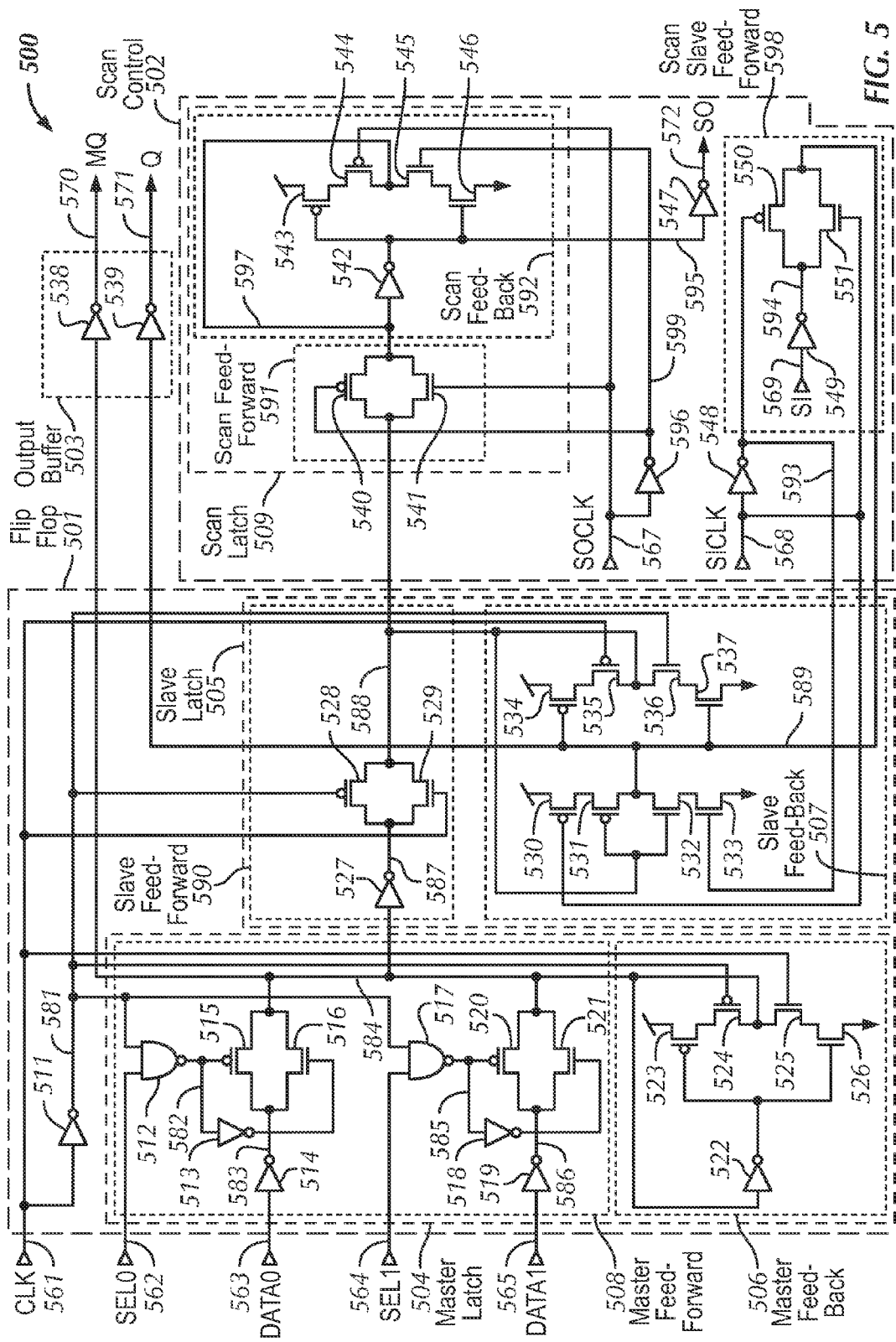
FIG. 5 shows a second SRAM macro test flop in accordance with one or more embodiments of the present invention.

FIG. 5 shows the second SRAM macro test flop 500 in accordance with one or more embodiments of the present invention. The second SRAM macro test flop 500 consists of three major blocks, flip-flop 501, scan control 502, and an output buffer 503. The output buffer 503 contains two drivers (master driver 538 and slave driver 539) to provide outputs respectively from master latch and slave latch of the flip-flop. The output from the master latch is fed as an input to the master driver 538, with master driver 538 driving MQ 570 as the master output from the flip-flop. The output from the slave latch is fed as an input to the slave driver 539, with slave driver 539 driving Q 571 as the slave output from the flip-flop.

The flip-flop 501 is driven by a clock signal, CLK 561, and data-in signals, DATA0 563 and DATA1 565. The CLK 561 drives inverter 511 to generate a complementary clock signal at node 581. There are two select signals SEL0 562 and SEL1 564 to provide respective selection for DATA0 563 and DATA1 565. The flip-flop 501 consists of two main components, a master latch 504 and a slave latch 505. The master latch 504 comprises master feed-forward 508 and master feed-back 506. The master feed-forward 508 of the master latch 504 is comprised of a two-to-one multiplexer. The master feed-back 506 of the master latch 504 is comprised of inverter 522 and a master inverting stage, with inverter 522 and the master inverting stage connected by back-to-back connection (master inverting stage is identified in FIG. 5 by reference to its components). The master inverting stage is comprised of a series stack of P-FET 523, P-FET 524, N-FET 525, and N-FET 526. In the back-to-back connection of inverter 522 and master inverting stage, output of inverter 522 is fed as input to master inverting stage and output of master inverting stage is fed as input to inverter 522. The output of master inverting stage in the master feed-back 506 forms a master storage node 584. The master feed-forward 508 provides a control signal for writing to master feed-back 506.

The master latch 504 has two modes of operation, a transparent mode and a hold mode. In the transparent mode with CLK 561 at a low logic state, DATA0 563 or DATA1 565 is transmitted through the master latch 504 to the output of master latch at master storage node 584. In the hold mode, CLK 561 is at a high logic state and master feed-back 506 of master latch 504 maintains the previous logic state on master storage node 584. The master storage node 584 provides input to the master driver 538, with output of master driver 538 driving as master output MQ 570. The master output MQ 570 is the output from master latch 504 of the flip-flop 501.

In the transparent mode of master latch 504, the two-to-one multiplexer in master feed-forward 508 is enabled with CLK 561 at a low logic state. The two-to-one multiplexer consists of two parts, MUX0 and MUX1 (which are identified in FIG. 5 by reference to their components). The MUX0 consists of P-FET 515, N-FET 516, NAND 512, inverter 513, and inverter 514. The MUX1 consists of P-FET 520, N-FET 521, NAND 517, inverter 518, and inverter 519. The MUX0 is selected for CLK 561 at low logic state and signal SEL0 562 at high logic state, and DATA0 563 is then transmitted through master feed-forward 508 to master storage node 584.

Because under conditions for selection of MUX0, both the inputs to NAND 512 are in high logic state, the output of NAND, i.e., node 582 is at low logic state. Thus, gate of P-FET 515 is at low logic state, and gate of N-FET 516 is at high logic state (due to inverter 513). This allows for transmission of data from DATA0 563 to master storage node 584 through inverter 514 and transmission gate comprising of P-FET 515 and N-FET 516.

On the other hand, the MUX1 is selected for CLK 561 at low logic state and signal SEL1 564 at high logic state. When the MUX1 is selected, DATA1 565 is transmitted through master feed-forward 508 to master storage node 584 in a similar manner as explained for MUX0. Because only one of MUX0 or MUX1 can be enabled in transparent mode, it is not permitted for both SEL0 562 and SEL1 564 to be simultaneously at high logic state. Furthermore, there is no contention presented by master inverting stage during transparent mode, because P-FET 524 and N-FET 525 are disabled by respective gates at high logic state and low logic state. During a subsequent hold mode with CLK 561 at a high logic state, master inverting stage is enabled with respective gates of P-FET 524 and N-FET 525 at low logic state and high logic state. This completes back-to-back connection in master feed-back 506 during hold mode, and thus stores the previously written logic state on master storage node 584.

The slave latch 505 comprises slave feed-forward 590 and slave feed-back 507. The slave feed-forward 590 of the slave latch 505 is comprised of P-FET 528, N-FET 529, and inverter 527. The slave feed-back 507 of the slave latch 505 is comprised of first slave inverting stage and second slave inverting stage with back-to-back connection (which are identified in FIG. 5 by reference to their components). The first slave inverting stage is comprised of a series stack of P-FET 530, P-FET 531, N-FET 532, and N-FET 533. The second slave inverting stage is comprised of a series stack of P-FET 534, P-FET 535, N-FET 536, and N-FET 537.

In the back-to-back connection of slave feed-back 507, output of first slave inverting stage is fed as input to second slave inverting stage and output of second slave inverting stage is fed as input to first slave inverting stage. The output of second slave inverting stage in the slave feed-back 507 forms a slave storage node 588. The output of first slave inverting stage forms another slave storage node 589, wherein data at slave storage node 589 is opposite in polarity to data at slave storage node 588. The slave feed-forward 590 provides a control signal for writing to slave feed-back 507.

The slave latch 505 also has two modes of operation, a transparent mode and a hold mode. In the transparent mode, the data at master storage node 584 is transmitted through the slave latch 505 to the output of slave latch 505 at slave storage node 588. During the transparent mode, CLK 561 is at high logic state and the node 581 is at low logic state (due to inverter 511). Thus, gate of P-FET 528 is at low logic state and gate of N-FET 529 is at high logic state. This allows for transmission of data from master storage node 584 to slave storage node 588 through inverter 527 and transmission gate comprising of P-FET 528 and N-FET 529.

During transparent mode, there is no contention presented by second slave inverting stage of slave feed-back 507, because P-FET 535 and N-FET 536 are disabled by respective gates at high logic state and low logic state. During a subsequent hold mode with CLK 561 at a low logic state (and, associated node 581 at high logic state), the second slave inverting stage is enabled with respective gates of P-FET 535 and N-FET 536 at low logic state and high logic state.

This completes back-to-back connection in slave feed-back 507 during hold mode, and thus maintains the previously written data on slave storage nodes 588 and 589. It is important to note that SICLK 568 is at low logic state during normal user operation, such that first slave inverting stage is in enabled state with respective gates of P-FET 530 and N-FET 533 at low logic state and high logic state. The slave storage node 589 provides input to the slave driver 539, with output of slave driver 539 driving as slave output Q 571. The slave output Q 571 is the output from slave latch 505 of the flip-flop 501.

The flip-flop 501 can now be described based upon the master latch 504 and slave latch 505 described above. During CLK 561 at low logic state, data-in at either DATA0 563 or DATA1 565 is transmitted through the master latch 504 to master storage node 584. During subsequent CLK 561 at high logic state, the master latch 504 is in hold mode and maintains the previous logic state on master storage node 584. But with CLK 561 at high logic state now, slave latch 505 is in transparent mode and data previously stored at master storage node 584 is transmitted through slave latch 505 and slave driver 539 to slave output Q 571. The slave output data at Q 571 may change once every cycle, on a low to high transition edge of the clock CLK 561.

The scan control 502 is integrated with flip-flop 501 for test capability. The scan control 502 comprises scan latch 509, scan slave feed-forward 598, and scan driver 547. The scan control 502 also contains inverters 548 and 596 to respectively provide inverting polarities for SICLK 568 and SOCLK 567. The scan latch 509 comprises scan feed-forward 591 and scan feed-back 592. The scan feed-forward 591 of the scan latch 509 is comprised of P-FET 540 and N-FET 541. The scan feed-back 592 in the scan latch 509 comprises inverter 542 and scan inverting stage connected back-to-back to form scan storage node 597, and scan storage node 595 with a complementary logic state (scan inverting stage is identified in FIG. 5 by reference to its components). The scan inverting stage is comprised of P-FET 543, P-FET 544, N-FET 545, and N-FET 546. The scan storage node 595 drives the input of scan driver 547, where the output of scan driver 547 is scan out signal SO 572. The SO 572 signal is available outside the second SRAM macro test flop 500 for test mode.

The SRAM testing requires that test data (e.g. scan data) be loaded into master latch 504 of flip-flop 501. This is accomplished in 3 steps. The first two steps comprise, scan-in step to load scan data to slave latch 505, and scan-out step to transfer the data loaded into slave latch 505 to scan latch 509. The third step comprises inputting data from scan out port to DATA1 565 with CLK 561 at low logic state and SEL1 564 at high logic state. The third scan step completes loading of the scan data to master feed-back 506 of the master latch 504.

During the first scan step (i.e. scan-in step), the scan-in data is written to the slave feed-back 507 of slave latch 505. During this step, SICLK 568 is at high logic state and node 593 is at low logic state (due to inverter 548). Thus, the scan-in data SI 569 is transmitted through inverter 549 and multiplexer comprising P-FET 550 and N-FET 551, and written to slave feed-back 507. There is no contention from first slave inverting stage, because P-FET 530 and N-FET 533 are disabled by respective gates at high logic state and low logic state. After completion of the first scan step, SICLK 568 is at low logic state along with CLK 561 at low logic state. This enables the first slave inverting stage and second slave inverting stage with gates of P-FET 530 and P-FET 535 at low logic state and N-FET 533 and N-FET 536 at high logic state. This completes back-to-back connection in slave feed-back 507 and maintains the previously written logic state at slave storage nodes 588 and 589.

During the second scan step (i.e. scan-out step), data in the slave feed-back 507 is written to scan feed-back 592 of scan latch 509. During this step, SOCLK 567 is at high logic state and node 599 is at low logic state (due to inverter 596). Thus, the data on slave storage node 588 is transmitted through multiplexer comprising P-FET 540 and N-FET 541, and written to scan feed-back 592 of scan latch 509. There is no contention from scan inverting stage, since P-FET 544 and N-FET 545 are disabled by respective gates at high logic state and low logic state. After scan data is written, the SOCLK 567 is at low logic state during hold mode. This enables the scan inverting stage with respective gates of P-FET 544 and N-FET 545 at low logic state and high logic state. This completes back-to-back connection in scan feed-back 592 and maintains the previously written logic states at scan storage nodes 597 and 595. The data at scan storage node 595 is fed as input to scan driver 547, with output of scan driver as scan out SO 572.

During the third/final scan step (i.e. scan-master step), data from scan feed-back 592 is written into master feed-back 506 of master latch 504. The data from scan out port SO 572 is fed as input to input port DATA1 565, with CLK 561 at low logic state and SEL1 564 at high logic state. This enables the transmission gate comprising P-FET 520 and N-FET 521 in master feed forward 508. Thus, the scan out data from SO 572 port is fed to DATA1 565 port and transmitted through inverter 519 and the transmission gate comprising P-FET 520 and N-FET 521, and the transmitted data is written to master feed-back 506. There is no contention from master inverting stage during this scan writing since P-FET 524 and N-FET 525 are in disabled state with respective gates at high logic state and low logic state.

After completion of scan write in third step, CLK 561 is at high logic state. This completes back-to-back connection in master feed-back 506 and maintains the previously written logic state at master storage node 584.

FIG. 5 describes, in one or more embodiments of present invention, making master latch output accessible outside the flip-flop and the ability to write scan/test data to master latch. Thus, scan/test data can be written to the master latch of the flip-flop and special SRAM testing can be carried out. Furthermore, a master output port MQ 570 has been provided to read out the master latch data. It will be obvious to those skilled in the art, that other embodiments with different configurations can be easily derived without deviating from the spirit of the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A SRAM (Static Random Access Memory) macro test flop circuit, driven by a source clock signal, comprising:
   a flip-flop circuit comprising:
      a master latch circuit comprising:
         a master feed-back circuit comprising a master storage node, and
         a master feed-forward circuit, wherein the master feed-forward circuit provides a control signal for writing to the master storage node, and
      a slave latch circuit comprising:
         a slave feed-back circuit comprising a slave storage node, and
         a slave feed-forward circuit operatively driven from the master latch, wherein the slave feed-forward circuit provides a control signal for writing to the slave storage node,
   a scan control circuit comprising:
      a scan slave feed-forward circuit providing a control signal for writing a scan data to the slave storage node,
      a scan latch circuit comprising:
         a scan feed-back circuit comprising a scan storage node,
         a scan feed-forward circuit operatively driven from the slave latch, wherein the scan feed-forward circuit provides a control signal for writing to the scan storage node, and
         a scan driver, with a scan output port, operatively driven by the scan feed-back circuit, and
      a scan master feed-forward circuit operatively driven from the scan latch, wherein the scan master feed-forward circuit provides a control signal for writing to the master storage node, and
   an output buffer circuit comprising:
      a master driver, with a master output port, operatively driven from the master latch, and
      a slave driver, with a slave output port, operatively driven from the slave latch.

2. The SRAM macro test flop circuit of claim 1, wherein a single polarity of the source clock signal is used in the SRAM macro test flop circuit.

3. The SRAM macro test flop circuit of claim 1, wherein the source clock signal is forced to a high logic state during writing scan data to the master storage node.

4. The SRAM macro test flop circuit of claim 1, the master feed-forward circuit comprising: a two to one multiplexer with first data-in and second data-in as two multiplexer inputs, wherein multiplexer output provides a control signal for writing to the master storage node.

5. The SRAM macro test flop circuit of claim 4, wherein the first data-in is operatively driven from user data.

6. The SRAM macro test flop circuit of claim 4, wherein the second data-in is operatively driven from the scan output port.

7. A semiconductor device comprising:
   a mechanical package; and
   a semiconductor die comprising:
      a semiconductor layer,
      a plurality of metal layers,
      a clock distribution network that distributes a clock signal within the die, and
      a SRAM (Static Random Access Memory) macro test flop circuit, driven by a source clock signal, comprising:
         a flip-flop circuit comprising:
            a master latch circuit comprising:

a master feed-back circuit comprising a master storage node, and
a master feed-forward circuit, wherein the master feed-forward circuit provides a control signal for writing to the master storage node, and
a slave latch circuit comprising:
a slave feed-back circuit comprising a slave storage node, and
a slave feed-forward circuit operatively driven from the master latch, wherein the slave feed-forward circuit provides a control signal for writing to the slave storage node,
a scan control circuit comprising:
a scan slave feed-forward circuit providing a control signal for writing a scan data to the slave storage node,
a scan latch circuit comprising:
a scan feed-back circuit comprising a scan storage node,
a scan feed-forward circuit operatively driven from the slave latch, wherein the scan feed-forward circuit provides a control signal for writing to the scan storage node, and
a scan driver, with a scan output port, operatively driven by the scan feed-back circuit, and
a scan master feed-forward circuit operatively driven from the scan latch, wherein the scan master feed-forward circuit provides a control signal for writing to the master storage node, and
an output buffer circuit comprising:
a master driver, with a master output port, operatively driven from the master latch, and
a slave driver, with a slave output port, operatively driven from the slave latch.

8. The semiconductor device of claim 7, wherein a single polarity of the source clock signal is used in the SRAM macro test flop circuit.

9. The semiconductor device of claim 7, wherein the source clock signal is forced to a high logic state during writing scan data to the master storage node.

10. The semiconductor device of claim 7, the master feed-forward circuit comprising: a two to one multiplexer with first data-in and second data-in as two multiplexer inputs, wherein multiplexer output provides a control signal for writing to the master storage node.

11. The semiconductor device of claim 10, wherein the first data-in is operatively driven from user data.

12. The semiconductor device of claim 10, wherein the second data-in is operatively driven from the scan output port.

13. A system comprising:
an input device;
an output device;
a mechanical chassis;
a printed circuit board; and
a semiconductor device comprising:
a mechanical package; and
a semiconductor die comprising:
a semiconductor layer,
a plurality of metal layers,
a clock distribution network that distributes a clock signal within the die, and
a SRAM (Static Random Access Memory) macro test flop circuit, driven by a source clock signal, comprising:
a flip-flop circuit comprising:
a master latch circuit comprising:
a master feed-back circuit comprising a master storage node, and
a master feed-forward circuit, wherein the master feed-forward circuit provides a control signal for writing to the master storage node, and
a slave latch circuit comprising:
a slave feed-back circuit comprising a slave storage node, and
a slave feed-forward circuit operatively driven from the master latch, wherein the slave feed-forward circuit provides a control signal for writing to the slave storage node,
a scan control circuit comprising:
a scan slave feed-forward circuit providing a control signal for writing a scan data to the slave storage node,
a scan latch circuit comprising:
a scan feed-back circuit comprising a scan storage node, a scan feed-forward circuit operatively driven from the slave latch, wherein the scan feed-forward circuit provides a control signal for writing to the scan storage node, and
a scan driver, with a scan output port, operatively driven by the scan feed-back circuit, and
a scan master feed-forward circuit operatively driven from the scan latch, wherein the scan master feed-forward circuit provides a control signal for writing to the master storage node, and
an output buffer circuit comprising:
a master driver, with a master output port, operatively driven from the master latch, and
a slave driver, with a slave output port, operatively driven from the slave latch.

14. The system of claim 13, wherein a single polarity of the source clock signal is used in the SRAM macro test flop circuit.

15. The system of claim 13, wherein the source clock signal is forced to a high logic state during writing scan data to the master storage node.

16. The system of claim 13, the master feed-forward circuit comprising: a two to one multiplexer with first data-in and second data-in as two multiplexer inputs, wherein multiplexer output provides a control signal for writing to the master storage node.

17. The system of claim 16, wherein the second data-in is operatively driven from the scan output port.

* * * * *